United States Patent [19]

Nakamura

[11] Patent Number: 5,067,229

[45] Date of Patent: Nov. 26, 1991

[54] CUTTING DEVICE FOR USE IN MANUFACTURING ELECTRONIC COMPONENTS

[75] Inventor: Nobuyuki Nakamura Kyoto, Japan

[73] Assignee: Rohm Co., Ltd., Kyoto, Japan

[21] Appl. No.: 601,934

[22] Filed: Oct. 22, 1990

Related U.S. Application Data

[62] Division of Ser. No. 488,129, Mar. 5, 1990.

[30] Foreign Application Priority Data

Mar. 7, 1989 [JP] Japan ............................. 1-26342 [U]

[51] Int. Cl.$^5$ .............................................. B23P 23/00
[52] U.S. Cl. ...................................... 29/566.1; 29/827; 51/125; 174/52.2; 361/400; 409/189; 409/191; 409/229; 437/206
[58] Field of Search ............... 29/827, 566.1; 361/400; 174/52.4, 52.2; 437/206, 217; 51/125, 216 WD; 409/189, 157, 190, 191, 192, 228, 229

[56] References Cited

U.S. PATENT DOCUMENTS

| 3,413,713 | 12/1968 | Helda et al. | 174/52.2 X |
| 3,423,516 | 1/1969 | Segerson | 174/52.2 |
| 3,444,441 | 5/1969 | Helda et al. | 174/52.2 X |
| 3,916,515 | 11/1975 | Walsh et al. | 361/400 X |
| 3,972,262 | 8/1976 | Albert, Jr. | 409/229 X |
| 4,054,238 | 10/1977 | Lloyd et al. | 174/52.4 X |
| 4,084,312 | 4/1978 | Kirk et al. | 174/52.4 X |
| 4,100,675 | 7/1978 | Landsittel | 29/827 |
| 4,466,183 | 8/1984 | Burns | 29/827 |
| 4,627,159 | 12/1986 | Waldner | 29/827 |
| 4,852,250 | 8/1989 | Andrews | 29/827 |

FOREIGN PATENT DOCUMENTS

| 3507294 | 9/1985 | Fed. Rep. of Germany . | |
| 211321 | 7/1984 | German Democratic Rep. . | |
| 254300 | 2/1988 | German Democratic Rep. . | |
| 57-190339 | 11/1982 | Japan | 29/827 |
| 61-65461 | 4/1986 | Japan | 29/827 |

Primary Examiner—Carl J. Arbes
Attorney, Agent, or Firm—William H. Eilberg

[57] ABSTRACT

The present invention provides a method of producing electronic components such as LED displays and hybrid IC's from a board supply frame. The frame comprises a parallel pair of elongate side bands, and a plurality of unit circuit boards integrally incorporated in the frame by means of connecting webs and arranged between the pair of side bands at a predetermined interval therealong. Various process steps such as chip bonding and wire bonding are performed with respect to the individual circuit boards while they are still in the frame. In a final step, each unit circuit board or electronic component is separated from the frame. The frame may be provided with an identification pattern to identify the type of unit circuit boards incorporated in the frame.

4 Claims, 4 Drawing Sheets

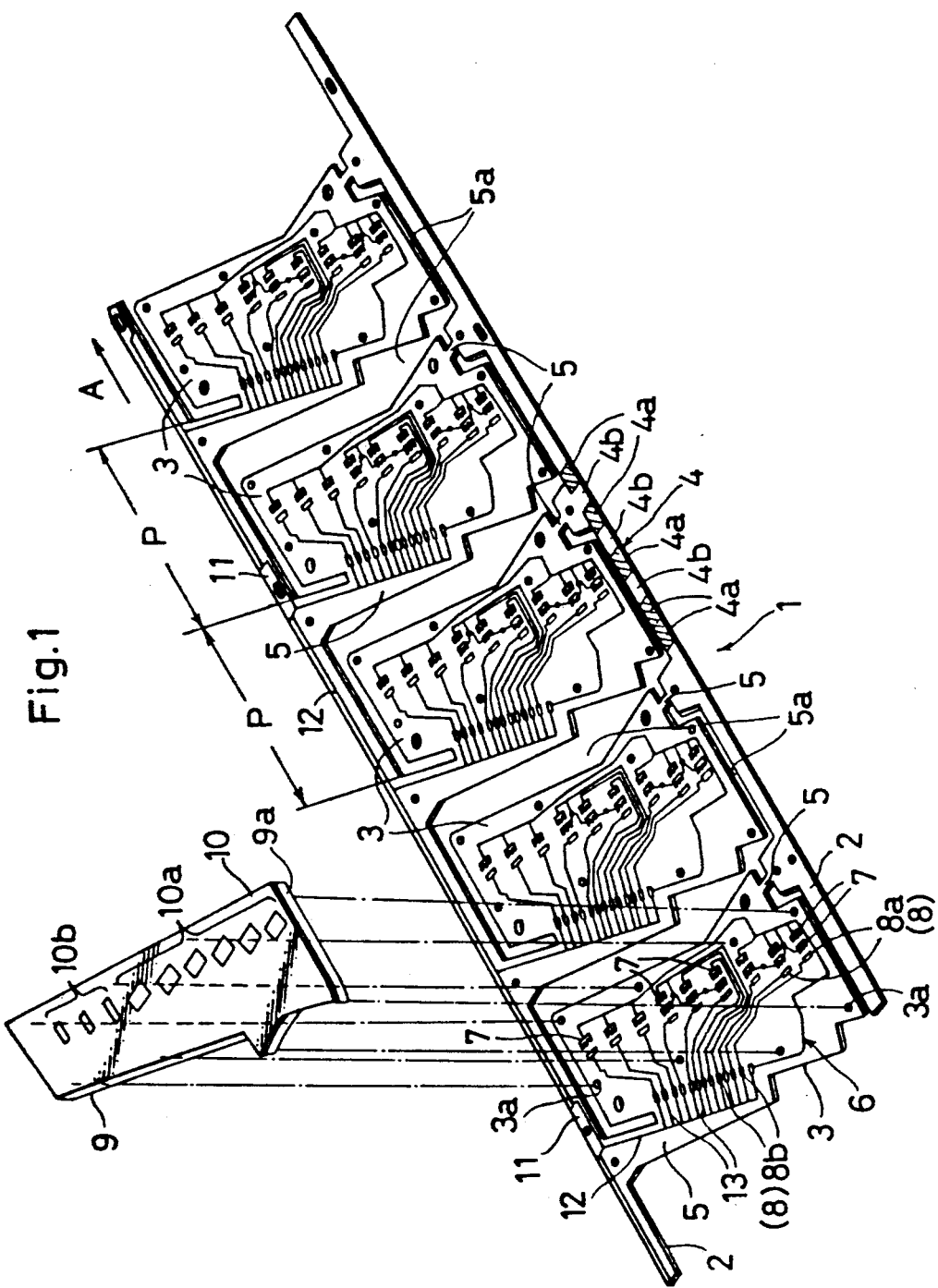

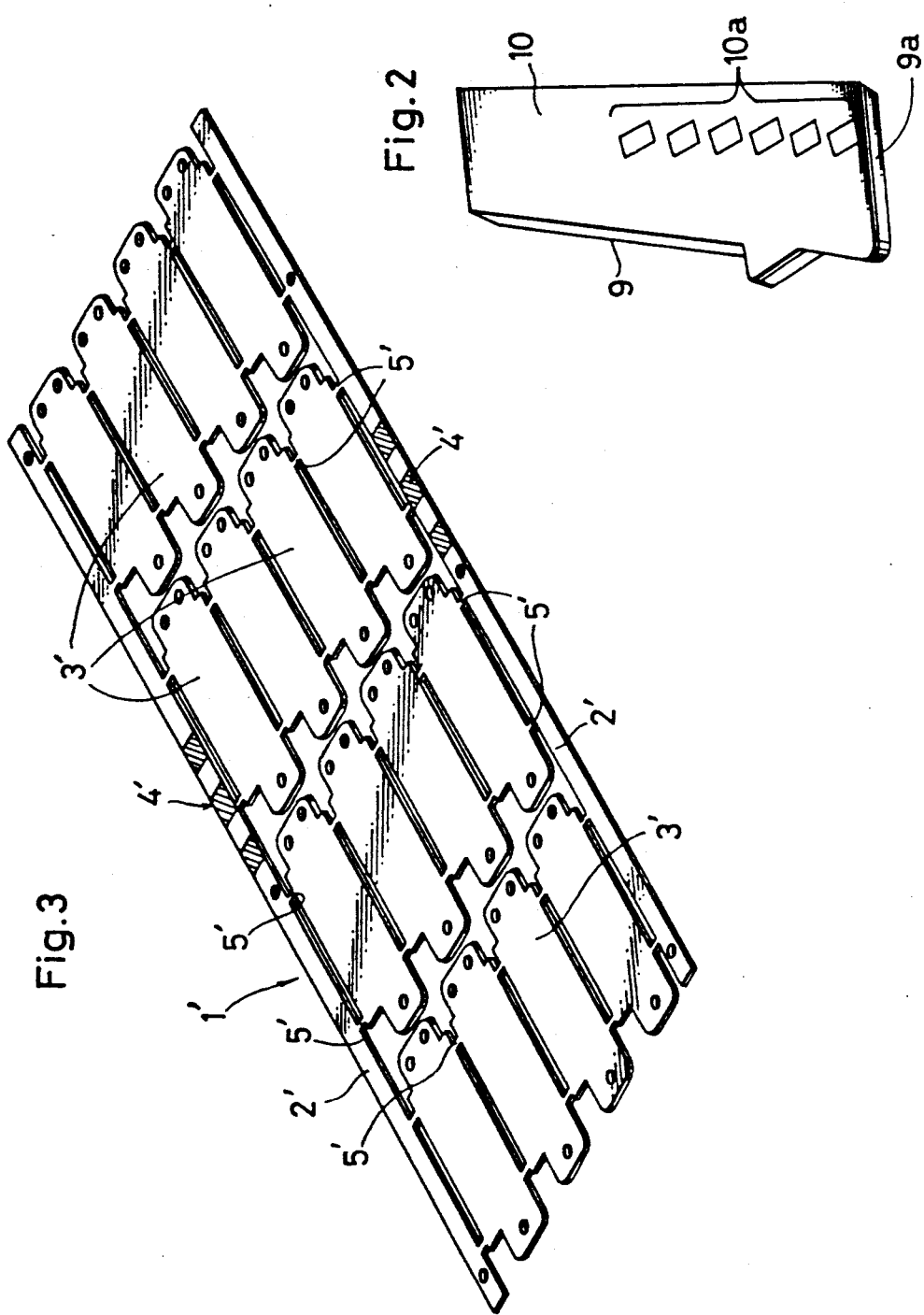

CUTTING DEVICE FOR USE IN MANUFACTURING ELECTRONIC COMPONENTS

This is a division of application Ser. No. 07/488,129, filed Mar. 5, 1990.

BACKGROUND OF THE INVENTION

1. Field of the Invention

This invention relates to a method of producing electronic components, such as LED displays and hybrid IC's, each of which comprises an electronic element or elements, such as light emitting diodes, transistors, and IC's, mounted on a printed circuit board. The invention also relates to a board supply frame and a cutting device both for use in performing such a method.

2. Description of the Prior Art:

As is well known, electronic components such as LED displays and hybrid IC's utilize a circuit board which is previously formed with a sophisticated conductor pattern. In manufacturing LED displays for example, LED's are bonded on chip mounting pads of each printed circuit board, and suitably wired to terminal pads, a display cover being mounted on the circuit board after suitably coating the LED's and the wires with a resin material. The hybrid IC's are manufactured by mounting individual electronic elements, such as IC's, resistors, and/or transistors, on each printed circuit board.

In a conventional production line for LED displays or hybrid IC's, individual circuit boards are successively but separately transferred, and during such transfer, various process steps such as chip mounting are conducted with respect to each circuit board. However, since there are various types of LED displays and hybrid IC's which naturally require differently dimensioned or configured circuit boards with different conductor patterns, the conventional production line has the following problems.

(1) The transfer system of the conventional production line needs to have a complicated adjusting mechanism in order to handle variously sized or configured circuit boards.

(2) It is difficult, if not impossible, to fully automate successive process steps and to automatically cope with a change in the type of printed circuit boards to be processed.

(3) It is necessary to prepare different jigs and board receiving magazines for differently sized or configured circuit board, with resultant necessity for replacement of these parts upon a change in the type of circuit boards to be processed.

SUMMARY OF THE INVENTION

It is therefore an object of the present invention to provide a method of producing electronic components which has overcome the conventionally experienced problems.

Another object of the present invention is to provide a board supply frame which is suitable for performing the method.

A further object of the present invention is provide a cutting device which enables damage-free separation of individual circuit boards from the board supply frame.

According to one aspect of the present invention, there is provided a method of producing electronic components comprising the steps of: transferring a board supply frame which comprises a parallel pair of elongate side bands, the board supply frame further comprising a plurality of unit circuit boards integrally incorporated in the frame by means of connecting webs and arranged between the pair of side bands at a predetermined interval therealong; mounting an electronic element or elements on each unit circuit board during transfer of the frame; and separating the unit circuit board from the frame by cutting the connecting webs.

With the arrangement described above, the plurality of unit circuit boards are integrated into the frame and transferred together as a single unit. The board supply frame as a whole may be made to have the same dimensions and configuration as other board supply frames in spite of a difference in dimension and configuration of unit circuit boards between the various frames.

In other words, according to the present invention, various types of board supply frames may be standardized with respect to their overall dimensions and configuration while allowing different specifications for the unit circuit boards. Such standardization enables a single transfer system to be utilized for different types of board supply frames without providing an adjusting mechanism for coping with dimensional and/or configurational differences, thereby simplifying the arrangement of the transfer system. Further, the frame standardization facilitates full automation of successive processes, and enables the use of a single jig and a single frame receiving magazine in each process step.

According to another aspect of the present invention, there is provided a board supply frame for use in producing electronic components, the frame comprising: a parallel pair of elongate side bands; a plurality of unit circuit boards integrally incorporated in the frame by means of connecting webs and arranged between the pair of side bands at a predetermined interval therealong; and an identification pattern provided on at least one of the side bands for identifying the type of the frame.

The provision of the identification pattern on the board supply frame makes it possible to automatically recognize the type of the unit circuit boards prior to or upon entry into each process unit, thereby enabling a most suitable operation in accordance with the particular specification of the unit circuit board. In other words, a single production line may be made to process different series of board supply frames without manually resetting the operational mode of each processing unit.

According to a further aspect of the present invention, there is provided a cutting device for use in manufacturing electronic components from a board supply frame which comprises a parallel pair of elongate side bands, the board supply frame further comprising a plurality of unit circuit boards integrally incorporated in the frame by means of connecting webs and arranged between the pair of side bands at a predetermined interval therealong, the cutting device comprising: an X-Y table arranged in a path of transfer of the frame, the table having a supporting portion which is reciprocally movable in an X-Y plane along an X-axis as well as along a Y-axis perpendicular to the X-axis, the X-Y plane being parallel to another plane containing the frame; and a spindle rotatably supported at the supporting portion of the X-Y table to extend toward the frame, the spindle having a front end provided with a rotary cutting or grinding element for severing the connecting webs of the frame.

The cutting device described above enables separation of each unit circuit board by rotationally cutting or grinding the connecting webs. This feature is significant in view of the fact that the circuit board or the board supply frame is made of a relatively fragile material such as glass-fiber-reinforced epoxy resin which may be often damaged upon application of a large pressure or force.

In fact, it is conceivable to utilize a combination of a punching die and a receiving die for cutting each unit circuit board off the board supply frame. Such a cutting device is often used in the processing of leadframes. However, this cutting device naturally exerts a relatively large punching pressure when used to punch the board supply frame which is made of a relatively hard but fragile material, consequently generating relatively large stresses in the frame. As a result, the punched unit circuit board may be cracked or otherwise damaged, or the conductor patter on the circuit board may be damaged.

The cutting device of the present invention applies only a rotary cutting or grinding force which is much smaller than a punching pressure. Therefore, the cut circuit board is substantially free of large stresses which may damage the circuit board or the conductor pattern thereon.

Further, the use of the X-Y table provides substantially any movement within the X-Y plane. Therefore, even if there is a change in the type of board supply frame to be processed, the X-Y table need only be operated in a different way to suit the new type of board supply frame (unit circuit board) without requiring replacement of the rotary cutting device itself This is much more advantageous than the conventional punching which necessitates, with a resulting cost increase, replacement or positional readjustment of the punching and receiving dies upon a change in the type of board supply frame.

Other objects, features and advantages of the present invention will be fully understood from the following detailed description given with reference to the accompanying drawings.

BRIEF DESCRIPTION OF THE DRAWINGS

In the accompanying drawings:

FIG. 1 is a perspective view showing a board supply frame embodying the invention;

FIG. 2 is a perspective view showing a display cover which is mounted on each unit circuit board incorporated in the board supply frame of FIG. 1;

FIG. 3 is a perspective view showing another board supply frame embodying the invention;

DETAILED DESCRIPTION

Figure 4:
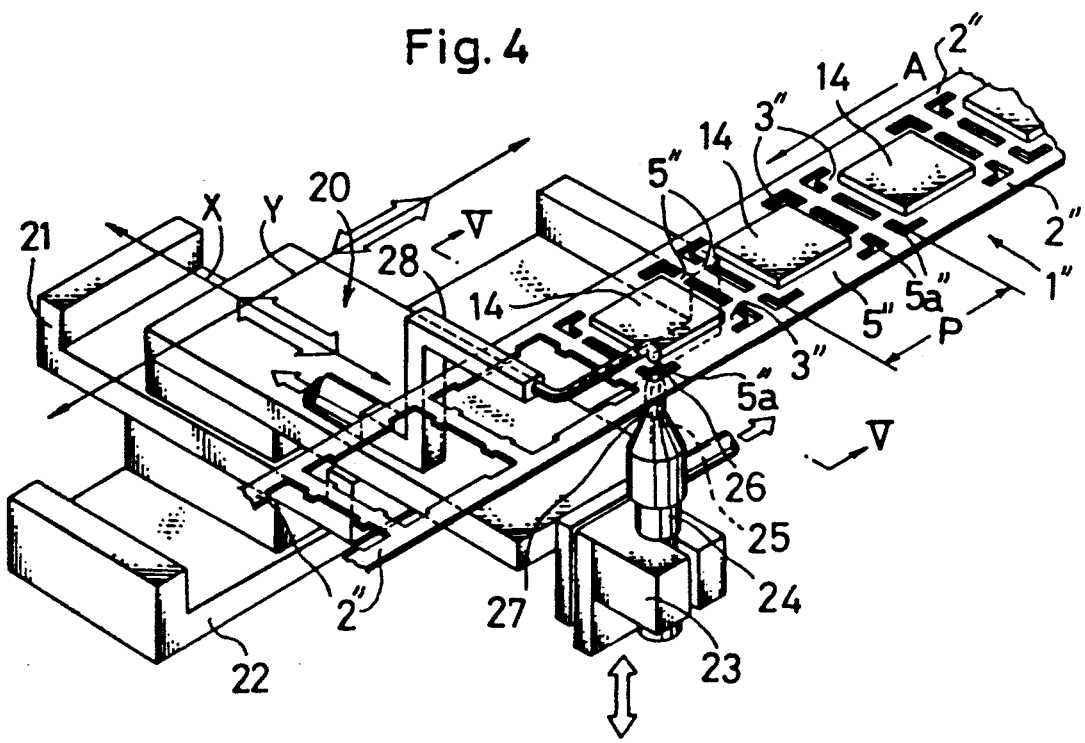
FIG. 4 is a perspective view of a cutting device according to the present invention as shown in connection with a further board supply frame also embodying the invention.

As already described, the present invention is applicable for producing various electronic components, such as LED displays and hybrid IC's, which utilize a printed circuit board. FIGS. 1 and 2 of the accompanying drawings show an embodiment wherein the present invention is used to produce LED displays each of which may be mounted to an automotive instrument panel for indicating a shift position and/or a control mode of an electronically controlled transmission.

As shown in FIG. 1, the production of the LED displays is conducted by using a board supply frame 1 which is made of glass-fiber-reinforced epoxy resin for example. The board supply frame comprises a parallel pair of elongate side bands 2, and a plurality of unit circuit boards 3 arranged between the pair of side bands at constant spacing P longitudinally thereof. According to the illustrated embodiment, one of the side bands 2 carries an identification pattern 4 for enabling recognition of the frame type, namely the type of the unit circuit boards 3 to be supplied by the frame, before working on the board frame. Additionally, a similar or different identification pattern may be provided on the other of the side bands.

The illustrated identification pattern 4 is located generally at the center of the relevant side band 2, and includes eight sections consisting of coated sections 4a and non-coated sections 4b to provide a 8-bit code. Thus, a particular combination of the coated and non-coated sections 4a, 4b enables exact identification of the board supply frame 1. The recognition of the identification pattern may be conducted for example by a light irradiation method wherein the irradiated light is reflected characteristically by the identification pattern to enable pattern recognition. Alternatively, the pattern recognition may be conducted by a magnetic sensor which magnetically detects the identification pattern, the sections 4a being coated for example with copper.

Each unit circuit board 3 is connected integrally to each side band 2 by one connecting web 5. Otherwise, the unit circuit board is surrounded or bounded by clearances 5a of varying width.

The unit circuit board 3 corresponds to a single electronic component. The unit board 3 has a mounting surface formed with a conductor pattern 6. This conductor pattern includes chip carrying pads 7 for respectively mounting LED chips (not shown), and terminal pads 8. The terminal pads 8 comprise inner terminal pads 8a located adjacent to the corresponding chip carrying pads 7, and outer terminal pads 8b located away from the chip carrying pads. As shown, some of the outer terminal pads 8b are connected to the chip carrying pads, whereas the remaining outer terminal pads are connected to the inner terminal pads 8a.

The conductor pattern 6 of the unit circuit board 3 may be formed in a known method. For instance, the entire mounting surface of the circuit board is first coated with copper, and the copper coating is thereafter etched into a predetermined pattern. The pads 7, 8 are further coated with gold for the convenience of subsequent chip bonding and wire bonding, whereas the remaining portions of the conductor pattern 6 are coated with a known insulating material.

In manufacturing electronic components, the board supply frame 1 is transferred longitudinally of the side bands 2, as indicated by an arrow A. During such transfer, the supply frame is passed through various processing units to conduct successive process steps with respect to the respective unit circuit boards 3. The successive process steps are now described below.

First, LED chips (not shown) are bonded onto the respective chip carrying pads 7 of each unit circuit board 3. In a subsequent wire bonding step, each chip is suitably connected to its associated inner terminal pad 8a or its adjacent chip carrying pad through a gold wire (not shown). After the chip and wire bonding, the LED chip together with the wire is coated with a small amount of epoxy resin for protection.

In a subsequent process step, a resinous display cover or case 9 is mounted on each unit circuit board 3. For this purpose, the display cover 9 has downwardly projecting pins (not shown) which are inserted into pin reception bores 3a of the circuit board to project partially therethrough. The projecting pin tips are thermally fused to the underside of the circuit board, thereby securing the cover to the board.

The display cover 9 consists of a substrate 9a and a covering sheet 10 attached to the display side of the substrate. The substrate 9a has light passage windows (not shown) corresponding in position to the LED chips of the unit circuit board 3. The light passage windows are filled for example with silicone resin containing light scattering powder. The covering sheet 10 has shift position indicating portions 10a and control mode indicating portions 10b in corresponding relation to the light passage windows of the substrate 9a. Selected ones of these indicating portions are illuminated upon actuation of relevant LED chips to indicate the shift position and the control mode. The position or mode indicating portions 10a, 10b may be provided by making these portions transparent or half-transparent.

Obviously, the mode indicating portions 10b alone may be omitted together with their associated LED chips depending on the automobile model and/or grade. FIG. 2 shows such an alternative arrangement for the display cover.

After mounting each display cover 9 to a corresponding unit circuit board 3, the board supply frame 1 as assembled is transferred to a checking unit (not shown) where the unit circuit board is checked for quality control. For this purpose, the outer terminal pads 8b are used for contact with checking probes (not shown) which cause lighting of the LED's. After the quality control, the board supply frame is fed to a cutting unit (not shown) where each unit circuit board 3 is cut off from the frame to provide a LED display as a final product (electronic component).

According to the present invention, the board supply frame which is a combination of the side bands 2 and the unit circuit boards 3, may be standardized with respect to the outer dimensions and configuration of the frame as a whole in spite of any change in dimension and configuration of the unit circuit boards. Therefore, a single transfer system can be used, without positional or dimensional readjustment, for transferring various kinds of standardized board supply frames irrespective of the kind of electronic components (unit circuit boards) to be manufactured, thereby simplifying the arrangement of the transfer system. Further, the standardization of the board supply frame facilitates full automation of successive processes, and enables the use of a single jig and a single frame receiving magazine in each process step.

The provision of the identification pattern 4 on the board supply frame 1 makes it possible to recognize the type of the unit circuit boards 3 prior to or upon entry into each process unit, thereby enabling a most suitable operation in accordance with the particular specification of the unit circuit board. For example, a single production line may be made to manufacture a series of LED displays having control mode indicating portions 10b (see FIG. 1) as well as another series of LED displays without such portions (see FIG. 2), the latter series requiring a smaller number of operations (chip bonding, wire bonding, and etc.) than the former series. The identification pattern 4 of a board supply frame for the latter series notifies a change in operational requirement prior to or upon entry into a bonding unit, thereby avoiding execution of unnecessary operations.

According to the embodiment illustrated in FIG. 1, one of the frame side bands 2, as already described, is formed with the identification pattern 4, whereas the other side band is provided with one or more common terminal pads 11 for quality control (lighting check). Each common terminal pad 11 is electrically connected to the outer terminal pads 8b of each unit circuit board 3 through a common conductor pattern 12 and a comb-like conductor pattern 13. The common terminal pad is also connected to the other common terminal pad or pads through the common conductor pattern 12.

Initially, all outer terminal pads 8b of each unit circuit board 3 are connected to the common conductor pattern 12 through the comb-like conductor pattern 13. However, for performing the lighting check of the individual LED's, those of the outer terminal pads 8b belonging to one polarity side (either positive or negative) are disconnected from the common conductor pattern 12 by removing or cutting off the relevant portions of the comb-like conductor pattern 13 while maintaining only the remaining outer terminal pads in conduction with the common terminal pad 11 which is oppositely polarized (either negative or positive) for the lighting check.

Obviously, the provision of the common terminal pad or pads 11 reduces the total number of probes necessary for simultaneously checking all LED's of each unit circuit board 3 because those of the outer terminal pads 8b belonging to either the positive or negative side require only a single probe. In the absence of such a common terminal pad, all of the outer terminal pads 8b must be held in contact with a corresponding number of probes for the simultaneous lighting check. It should be further appreciated that each common terminal pad 11 may be used equally for all unit circuit boards in the lighting check.

In the embodiment illustrated in FIG. 1, the unit circuit boards 3 are arranged in a single row between the side bands 2 of the board supply frame 1. However, such unit circuit boards may be arranged in two or more rows extending along and between the side bands, as shown in FIG. 3.

More particularly, the modified board supply frame 1' shown in FIG. 3 comprises a parallel pair of elongate side bands 2', and a plurality of unit circuit boards 3' in four rows extending along and between the side bands. The unit circuit boards are integral with each other and with the side bands by means of connecting webs 5'. Further, in this modification, each of the side bands 2' carries an identification pattern 4' consisting of coated and non-coated portions.

In the foregoing embodiment, the identification pattern 4, 4' comprises a combination of coated portions and non-coated portions. However, such an identification pattern may be replaced by a combination of perforated portions and non-perforated portions which enables pattern recognition by an optical method for example.

Figure 5:
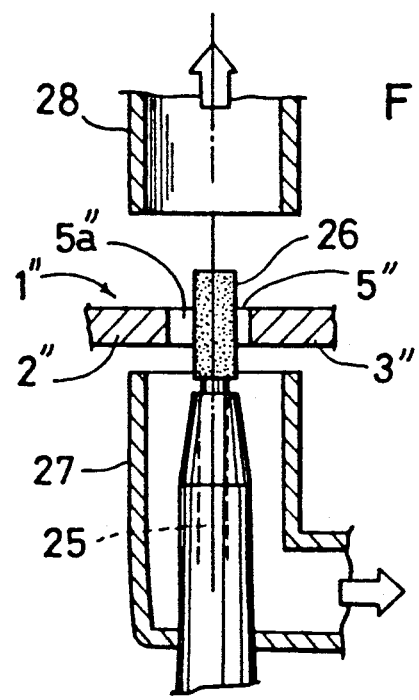
FIG. 5 is a sectional view taken on lines V-V in FIG. 4.

FIGS. 4 and 5 shows a cutting device which is used in manufacturing electronic components. Specifically, the cutting device is used to cut each assembled electronic component from a board supply frame 1" at the final stage of the manufacturing process.

The board supply frame 1" shown in FIGS. 4 and 5 comprises a parallel pair of elongate side bands 2", and a plurality of unit circuit boards 3" arranged at a constant spacing P in a row extending along and between the side bands. Each unit circuit board 3" is rendered integral with the frame by means of connecting webs 5", and surrounded by clearances 5a". Though not illustrated, each or both of the side bands may be provided with an identification pattern which is similar to that illustrated in FIG. 1 or 3.

The board supply frame 1" is transferred in the direction of an arrow A. During such transfer, an electronic element 14 such as a transistor is mounted on each unit circuit board 3". After suitable operations have been performed, the frame is transferred to a cutting unit where the illustrated cutting device is arranged.

The cutting device comprises an X-Y table 20 which is arranged below the transfer path of the board supply frame 1". The table includes an X-axis carriage 21 which is reciprocally movable along an X-axis perpendicular to the longitudinal axis of the board supply frame. The table also includes a Y-axis carriage 22 which is reciprocally movable along a Y-axis parallel to the longitudinal axis of the frame. The X- and Y-axes are contained in a plane (X-Y plane) which is substantially parallel to the plane of the frame 1".

The cutting device further comprises a tool assembly 30 including a spindle carriage 23 which is movable perpendicularly to the X-Y plane. The spindle carriage supports an upwardly projecting spindle 25 which is rotated at high speed by an electric motor 24. The spindle 25 is provided at its upper end with a rotary cutting or grinding element 26 having a diameter or size smaller than the minimum width of the clearances 5a" around each unit circuit board 3". The cutting or grinding element 26 may be detachable from the spindle 25 for replacement. Obviously, the spindle 25 or the rotary element 26 mounted thereon may be brought to any position within the X-Y plane by suitably moving both carriages 21, 22 of the X-Y table 20.

As better illustrated in FIG. 5, an upper portion of the spindle 25 is provided with a lower suction duct 27 which is located below the board supply frame 1" and connected to a suction fan (not shown). The lower suction duct opens upwardly toward the frame. Above the spindle 25 is also disposed an upper suction duct 28 connected to another suction fan (not shown) and opening downwardly toward the frame. It is of course possible to connect a single suction fan to both of the upper and lower suction ducts. Though not illustrated, there is actually provided a handling mechanism for holding the board supply frame 1" from above.

In performing the cutting operation, the board supply frame 1" is held at a predetermined position by the handling mechanism (not shown). Then, the spindle 25 is adjusted in the X-Y plane by suitably moving the X-Y table 20, so that the spindle is located immediately under one of the clearances 5a" associated with a particular unit circuit board 3". Subsequently, the spindle carriage 23 is raised until the cutting or grinding element 26 is inserted into that one clearance. Finally, the rotary element 26 is put into rotation by the motor 24, and the X-Y table 20 is operated to cause the rotary element 26 to move around the particular unit circuit board 3" along the clearances 5a". As a result, the associated connecting webs 5" are cut away to remove the unit circuit board (electronic component).

According to the embodiment shown in FIGS. 4 and 5, fragments or particles are generated as a result of the cutting operation. However, the suction ducts 27, 28 suck away such fragments or particles to prevent them from scattering.

Figure 6:
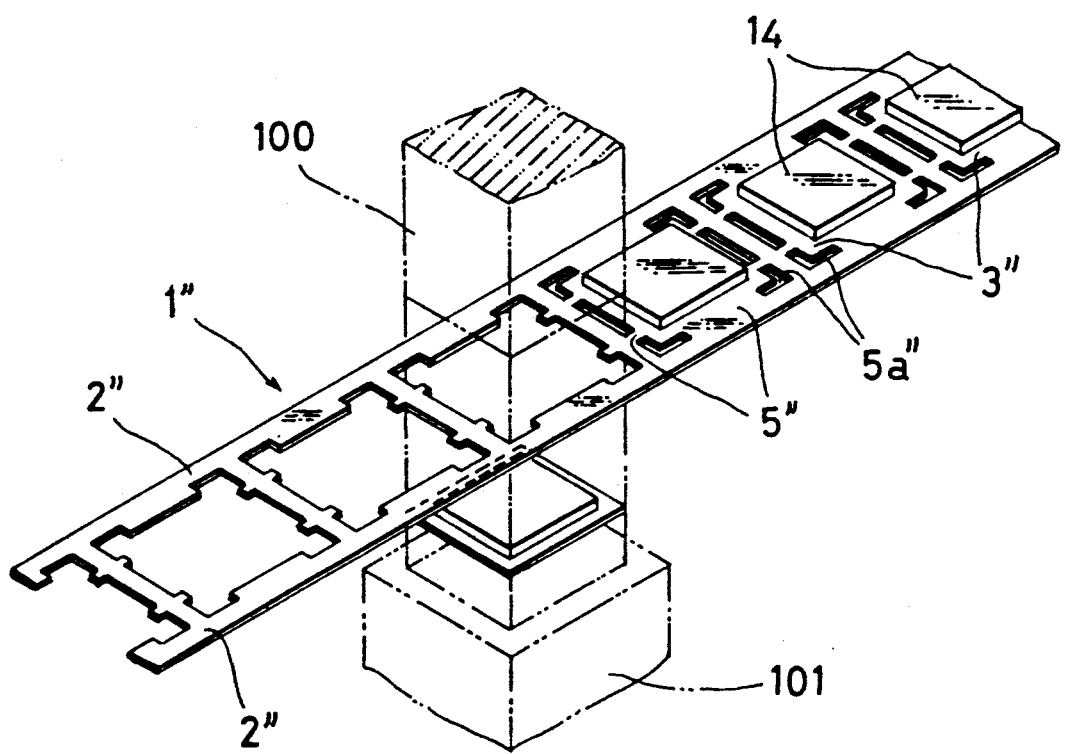
FIG. 6 is a perspective view showing a conventional leadframe cutting device as hypothetically used in combination with the board supply frame illustrated in FIG. 4.

The cutting device of the present invention is advantageous in various points. To better explain such advantages, reference is now made to FIG. 6 showing a conventional cutting device which is used for example in connection with a leadframe, as disclosed for example in Japanese Laid-open Utility Model Application No. 62-199959. FIG. 6 also shows a board supply frame 1" (identical to the one shown in FIG. 4) only to explain how the conventional cutting device could be used with respect to the board supply frame if such is attempted. Therefore, it should be understood that FIG. 6 shows the prior art only with respect to the cutting device but not with respect to the board supply frame which itself is entirely new.

As shown in FIG. 6, the conventional cutting device comprises an upper punching die 100 and a lower receiving die 101. In use, the upper punching die is lowered to apply pressure relative to a workpiece (leadframe for example) arranged between both dies, thereby punching out a specified portion of the workpiece in each punching operation.

Usually, printed circuit boards for electronic components (LED displays, hybrid IC's, and etc.) are made of a thermosetting resin such as glass-fiber-reinforced epoxy resin which is known to be relatively fragile. Therefore, if the conventional punching device is used for cutting each unit circuit board 3" off the board supply frame 1" (see FIG. 6), the board supply frame will be subjected to relatively large stresses upon application of punching pressure. As a result, the cut circuit board may be cracked or otherwise damaged, or the conductor pattern applied on the circuit board is damaged, thus lowering the yield of acceptable products. Further, when a different type of board supply frame is to be processed, it becomes necessary to employ a correspondingly different combination of a punching die and a receiving die.

The cutting device of the present invention incorporates the rotary cutting or grinding element 26 which may be made to move around each unit circuit board 3" by means of the X-Y table 20. The rotary element 26 applies, for severing the connecting webs 5", only a cutting or grinding force which is much smaller than a punching pressure. Therefore, the circuit board is substantially free of large stresses which may damage the circuit board or the conductor pattern thereon.

Further, the movement of the rotary element 26 can be controlled substantially in any way by suitably operating the X-Y table 20. Therefore, even if there is a change in the type of board supply frame to be processed, the X-Y table 20 need only be operated in a different way to suit the new type of board supply frame without requiring replacement of the rotary cutting device itself. This is much more advantageous than the conventional punching device which necessitates, with with a resultant cost increase, replacement of the punching and receiving dies upon a change in the type of board supply frame to be processed.

Obviously, the cutting device of FIGS. 4 and 5 are equally applicable to the board supply frame 1 or 1' shown in FIG. 1 or 3.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. A cutting device for use in manufacturing electronic components from a board supply frame which comprises a parallel pair of elongate side bands, said board supply frame further comprising a plurality of unit circuit boards integrally incorporated in said frame by means of connecting webs and arranged between said pair of side bands at a predetermined interval therealong, said cutting device comprising:

an X-Y table arranged in a path of transfer of said frame, said table having a supporting portion which is reciprocally movable in an X-Y plane along an X-axis as well as along a Y-axis perpendicular to said X-axis, said plane being parallel to another plane containing said frame; and a spindle rotatably supported at said supporting portion of said X-Y table to extend toward said frame, said spindle having a front end provided with a rotary cutting or grinding element for severing said connecting webs of said frame.

2. The cutting device as defined in claim 1, further comprising suction duct means arranged adjacent said rotary cutting or grinding element and opening toward said frame.

3. The cutting device as defined in claim 2, wherein said suction duct means comprises a first suction duct arranged on one side of said another plane, and a second suction duct arranged on the opposite side of said another plane.

4. The cutting device as defined in claim 1, wherein said supporting portion of said X-Y table is provided with a carriage which is reciprocally movable perpendicularly to said X-Y plane.

* * * * *